(12) United States Patent
Kasuta (10) Patent No.: US 7,808,830 B2
(45) Date of Patent: Oct. 5, 2010

(54) SEMICONDUCTOR DEVICE AND METHOD FOR ADJUSTING REFERENCE LEVELS OF REFERENCE CELLS

(75) Inventor: Yoshinori Kasuta, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 88 days.

(21) Appl. No.: 12/026,417

(22) Filed: Feb. 5, 2008

(65) Prior Publication Data

US 2008/0192537 A1 Aug. 14, 2008

(30) Foreign Application Priority Data

Feb. 5, 2007 (JP) .............................. 2007-025337

(51) Int. Cl.
*G11C 16/06* (2006.01)
(52) U.S. Cl. ............. 365/185.2; 365/210.1; 365/210.12
(58) Field of Classification Search ............. 365/185.2, 365/210.1, 185.22, 210.12
See application file for complete search history.

(56) References Cited

U.S. PATENT DOCUMENTS 5,687,114 A * 11/1997 Khan .................... 365/185.03
6,529,405 B2 * 3/2003 Chang ................... 365/185.03
6,584,017 B2 * 6/2003 Maayan et al. ......... 365/185.22
6,639,849 B2 * 10/2003 Takahashi et al. ...... 365/185.03
6,751,131 B2 * 6/2004 Yamano ................. 365/189.07
6,754,125 B2 * 6/2004 Fournel et al. ............... 365/222
6,813,189 B2 * 11/2004 Kurihara .................. 365/185.2
6,912,160 B2 * 6/2005 Yamada ................... 365/185.2
7,158,415 B2 * 1/2007 Bedarida et al. ......... 365/185.2
7,499,331 B2 * 3/2009 Ohsawa ................... 365/185.2
2004/0130943 A1 * 7/2004 Hirano et al. .......... 365/185.01
2006/0239093 A1 * 10/2006 Mukunoki ................. 365/210
2007/0189094 A1 * 8/2007 Ohsawa ..................... 365/210

FOREIGN PATENT DOCUMENTS

JP 2004087047 3/2004

\* cited by examiner

*Primary Examiner*—Tuan T Nguyen
*Assistant Examiner*—R Lance Reidlinger (57) ABSTRACT

A semiconductor device includes a first reference cell used for programming or reading non-volatile memory cells, and an adjustment circuit adjusting a first reference level of the first reference cell when the first reference level is changed.

13 Claims, 8 Drawing Sheets

SEMICONDUCTOR DEVICE AND METHOD FOR ADJUSTING REFERENCE LEVELS OF REFERENCE CELLS

TECHNICAL FIELD

The present invention relates generally to semiconductor devices and methods for controlling the same, and more particularly, to a semiconductor device having non-volatile memory cells and a method for controlling the same.

BACKGROUND OF THE INVENTION

Recently, non-volatile memories that are programmable and erasable semiconductor devices have been widely used. A flash memory, which is a typical non-volatile memory, has a transistor that acts a memory cell and holds a charge in a charge storage layer to store data. There are a floating gate type flash memory using a floating gate as the charge storage layer, and a SONOS (Silicon Oxide Nitride Oxide Silicon) type flash memory in which a charge is stored in a trap layer formed by a silicon nitride layer.

Data is written into the non-volatile memory cell by injecting hot electrons into the charge storage layer (that is, storing charge in the charge storage layer). More particularly, a high voltage may be applied between the source and the drain of the transistor of the memory cell, and a positive voltage may be applied to the control gate. Thus, the hot electrons generated between the source and the drain are injected into the charge storage layer. The charge (electrons) injected into the charge storage layer raises the threshold voltage of the memory cell transistor. Data written into the memory cell is read by measuring the threshold voltage using current.

Conventionally, the non-volatile memory has a problem arising from charge gain or soft program. It is required to restrain this kind of problem without degrading the read margin and increasing the chip area.

SUMMARY OF THE INVENTION

The present invention has been made in view of the above circumstances and provides a semiconductor device and a method for controlling the same.

According to an aspect of the present invention, there is provided a semiconductor device including: a first reference cell used for programming or reading non-volatile memory cells; and an adjustment circuit adjusting a first reference level of the first reference cell when the first reference level is changed.

According to another aspect of the present invention, there is provided a method for controlling a semiconductor device including: comparing a first reference level of a first reference cell used for programming or reading non-volatile memory cells and a second reference level of a second reference cell with each other; and adjusting the first reference level on the basis of a comparison result.

DETAILED DESCRIPTION

In order to facilitate better understanding of the present invention, a description will now be given of a comparative NOR type non-volatile memory.

Figure 1:
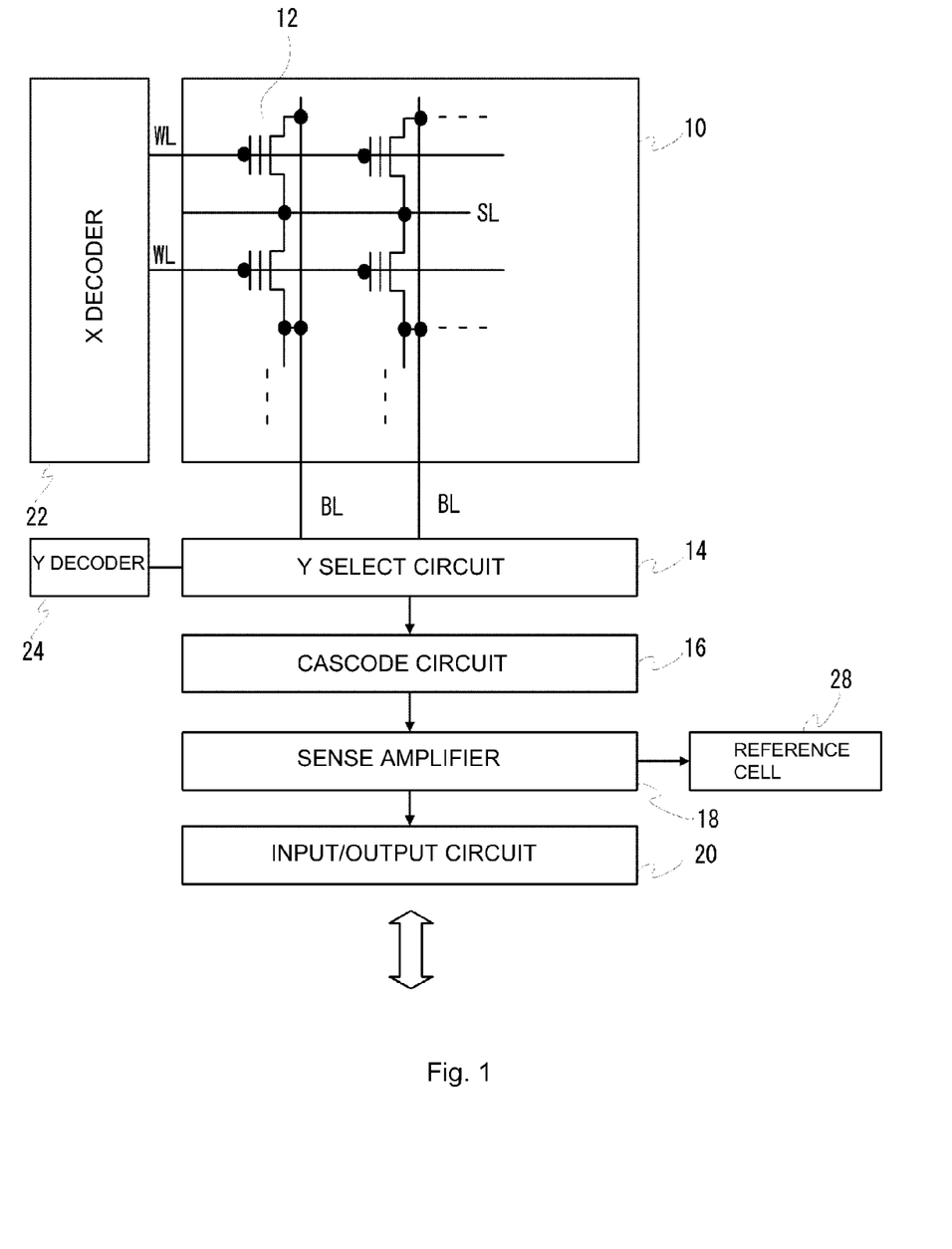
FIG. 1 is a block diagram of a circuit involved in reading data from a non-volatile memory cell array of NOR type.

FIG. 1 is a block diagram of a circuit involved in reading data from a non-volatile memory cell array of NOR type. A memory cell array 10 has non-volatile memory cells 12 arranged in rows and columns. The gates of transistors that form the memory cells 12 are connected to associated word lines WL, and the sources are connected to associated source lines SL, and the drains are connected to associated bit lines BL. An X decoder 22 selectively drives the word lines WL, and a Y decoder 22 selectively drives the bit lines BL via a Y select circuit 14. Thus, memory cells 12 from which data should be read are selected. The bit lines BL selected by the Y select circuit 14 are connected to a cascode circuit 16. The cascode circuit 16 converts currents flowing through the selected memory cells 12 into voltages. A sense amplifier 18 compare the currents flowing through the selected memory cells 12 with a current flowing through a reference cell 28, and determines whether the data read from the selected memory cells 12 are "0" or "1". An input/output circuit 20 outputs the data thus sensed to an external circuit. The data stored in the non-volatile memory cells 12 can be read by the above sequence. A cascode circuit that converts the current flowing through the reference cell 28 into a voltage is not shown for the sake of simplicity.

Japanese Patent Application Publication No. 2004-87047 discloses a non-volatile memory having multiple reference cells, which are switched for every read cycle.

Figure 2:
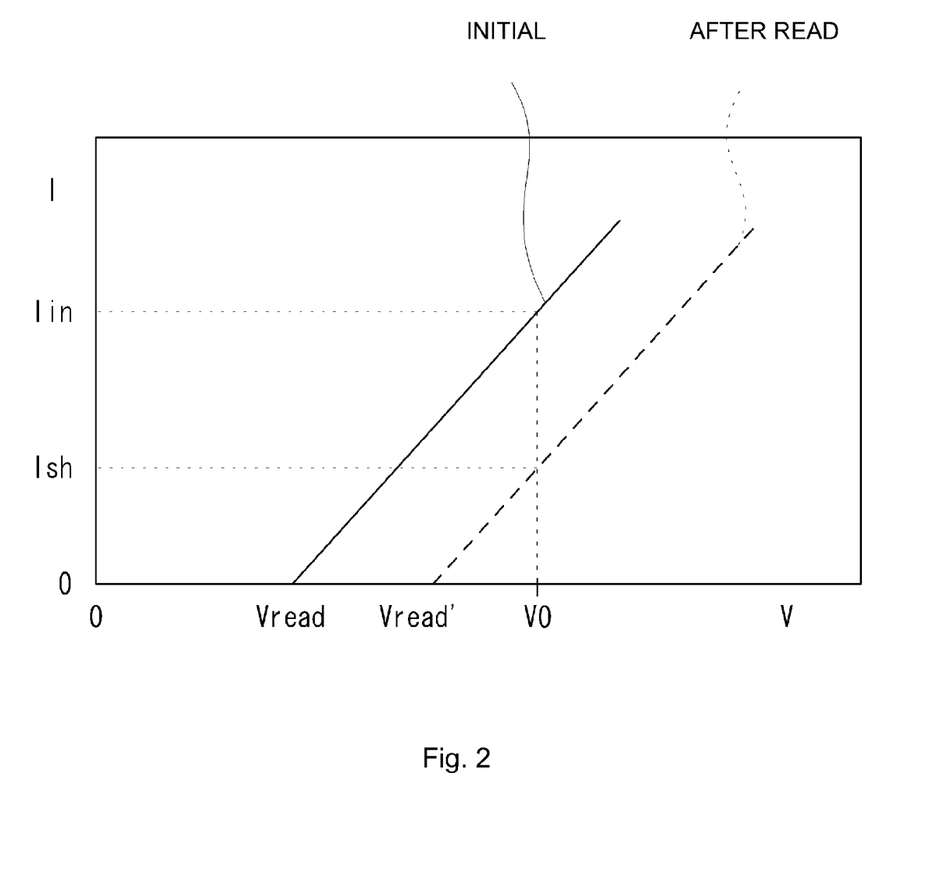
FIG. 2 is a graph showing a problem in which a reference level shifts due to charge gain.

Normally, data is read from one reference cell 28 each time data are read from the multiple memory cells 12. That is, a voltage is applied to the gate of the reference cell 28 each time data are read from the memory cells 12. When the voltage is applied to the gate, an extremely small amount of charge may be stored in the charge storage layer. In this manner, charge is gradually stored in the reference cell 28. This phenomenon is called charge gain or soft program. FIG. 2 is a graph of a drain current vs. gate voltage (I-V) characteristic of the transistor of the reference cell 28. The read cycle is repeatedly carried out and the I-V characteristic shifts to the positive side from an initial I-V characteristic because charge is accumulated in the charge storage layer. A threshold voltage Vth shifts from Vread to Vread' in the positive direction. When the gate voltage at the time of reading data from the reference cell 28 is V0, the drain current I shifts from an initial value Iin to Ish after read cycles.

The charge gain may be restrained by reducing the voltage applied to the gate of the reference cell 28 at the time of reading. However, the read margin is reduced. The charge gain may be restrained by preparing the multiple reference cells and switching the reference cells for every read cycle, as proposed in the above-mentioned application publication. It is thus possible to reduce the charge gain per reference cell. However, this method uses the multiple reference cells and increases the chip area.

According to an aspect of the present invention, there is provided a semiconductor device and its control method capable of restraining shift of the reference cell caused by charge gain without degrading the read margin and increasing the chip area.

A description will now be given of embodiments of the present invention with reference to the accompanying drawings.

First Embodiment

Figure 3:
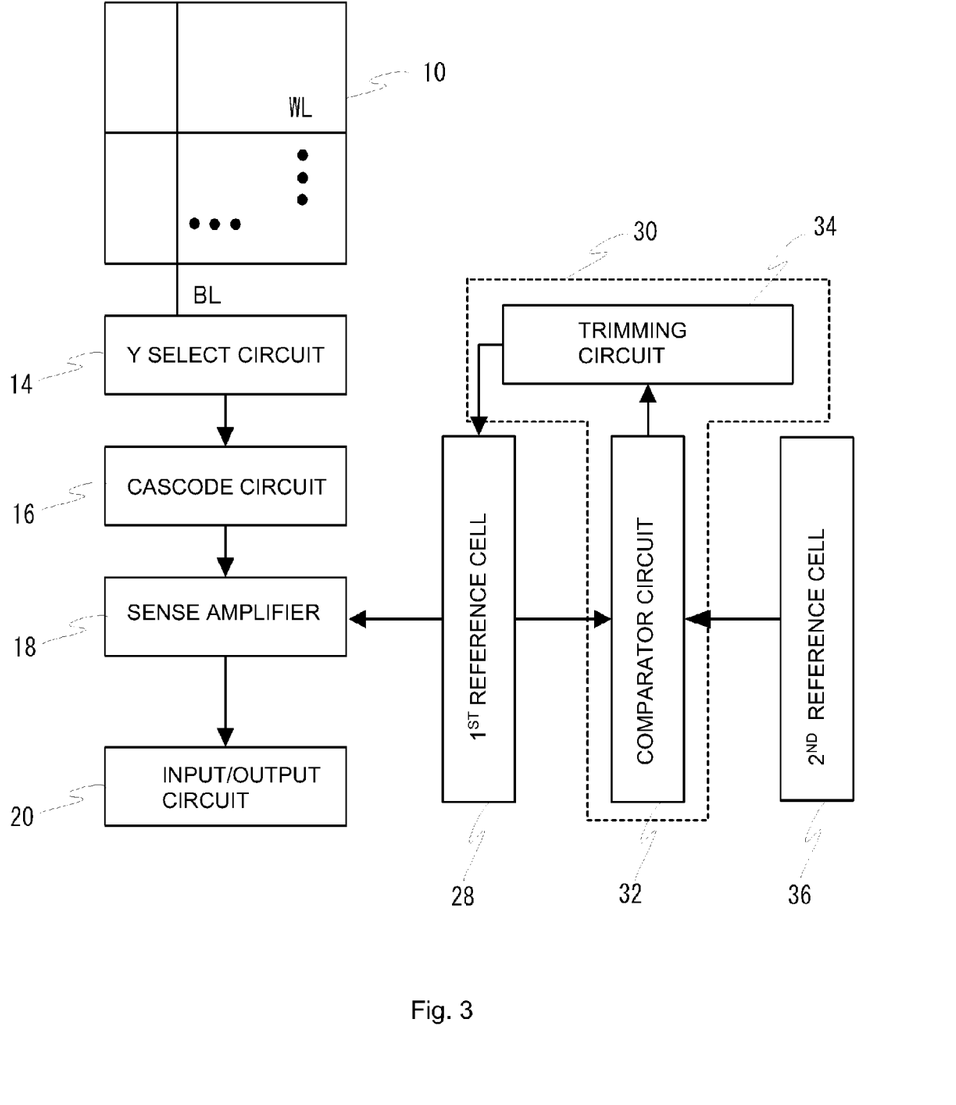
FIG. 3 is a block diagram of a non-volatile memory in accordance with a first embodiment.

FIG. 3 is a block diagram of a non-volatile memory in accordance with a first embodiment. As compared to FIG. 1 showing the comparative non-volatile memory, the first reference cell 28, an adjustment circuit 30 and a second reference cell 36 are substituted for the reference cell 28. The adjustment circuit 30 has a comparator circuit 32 and a trimming circuit 34. The remaining structure of the memory shown in FIG. 3 is the same as that of the memory shown in FIG. 1.

Figure 4:
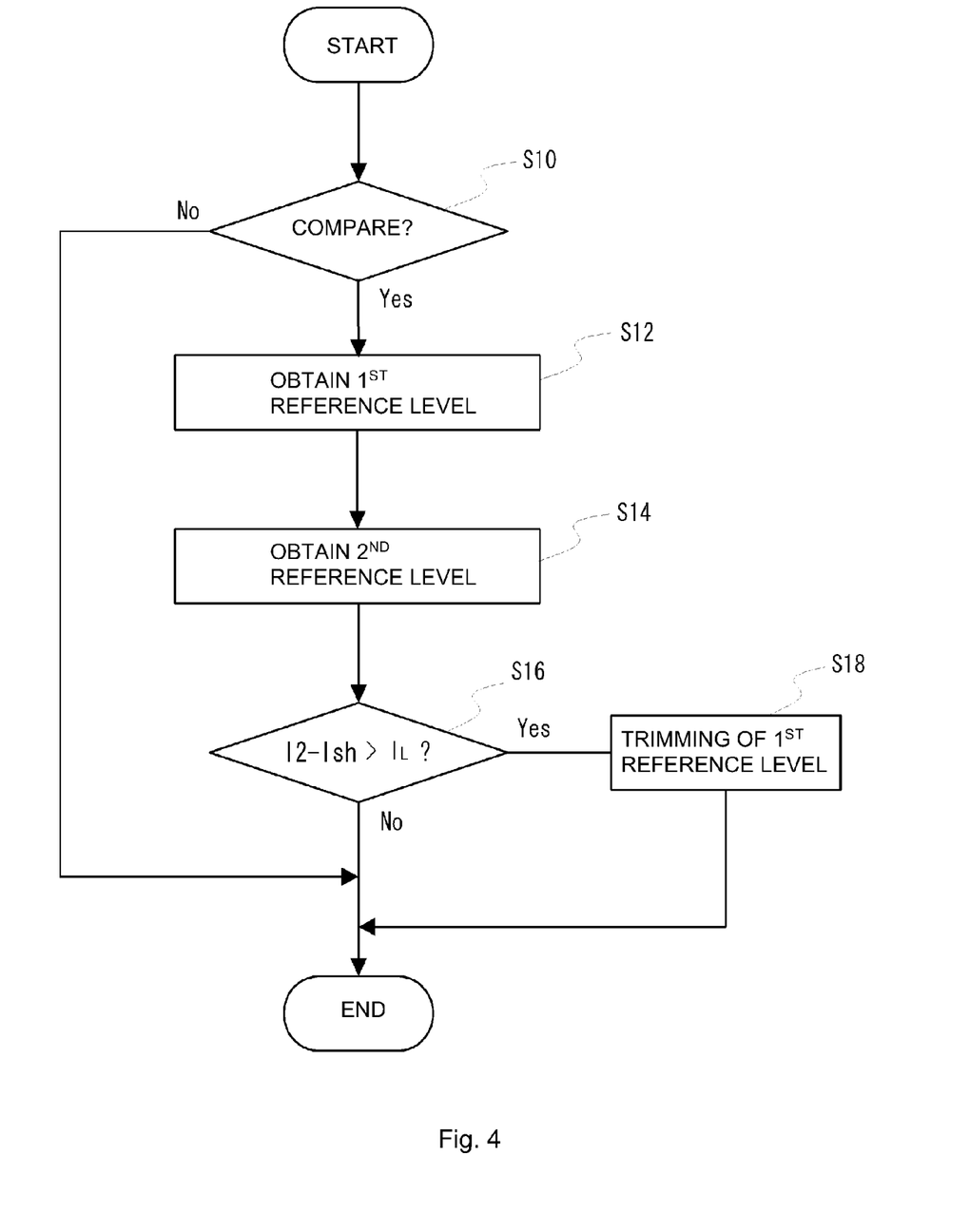
FIG. 4 is a flowchart of an operation of the non-volatile memory in accordance with the first embodiment.
Figure 5:
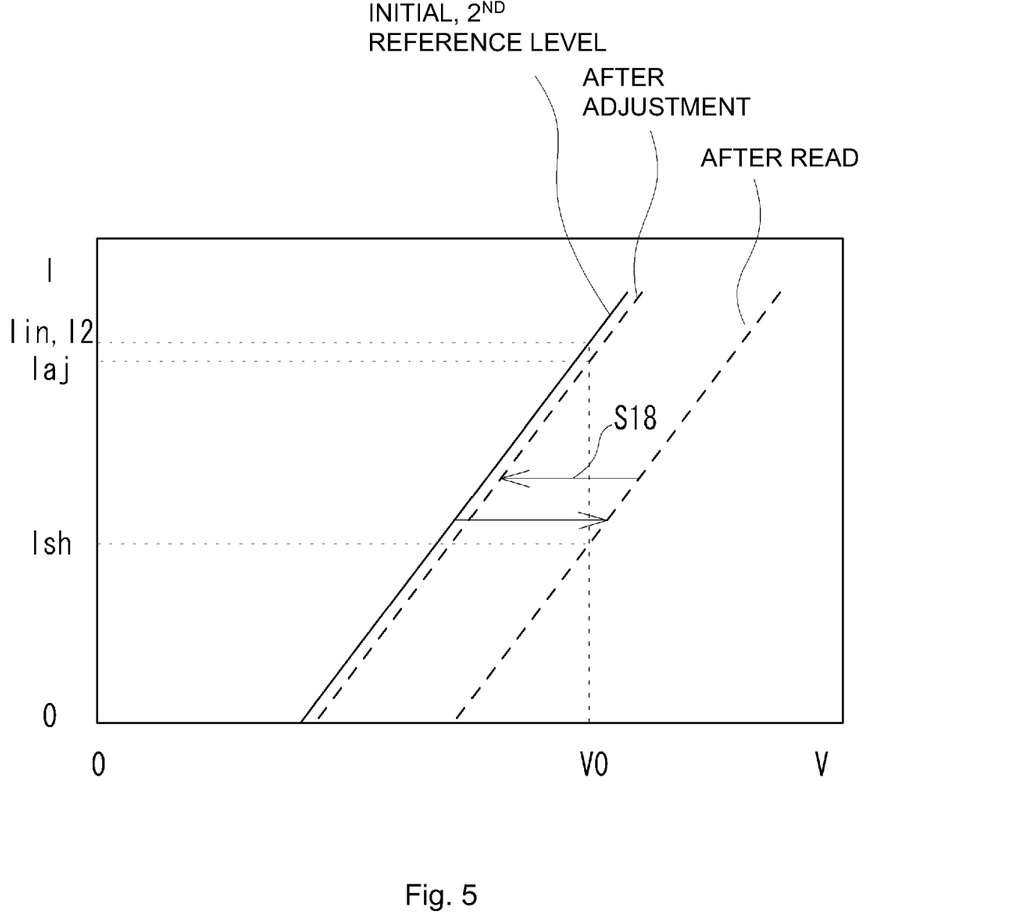
FIG. 5 shows reference levels employed in the non-volatile memory in accordance with the first embodiment.

FIG. 4 is a flowchart of a method for controlling the non-volatile memory shown in FIG. 3, and FIG. 5 is an I-V characteristic of the first reference cell 28 shown in FIG. 3. As shown in FIG. 5, in the initial state, a current level Iin of the first reference cell 28 (first reference level) and a current level I2 of the second reference cell 36 (second reference level) are approximately equal to each other. It is assumed that the first reference cell 28 is repeatedly read many times. Charge gain takes place, and the current level of the first reference cell 28 is decreased to Ish. Referring to FIG. 4, the adjustment circuit 30 shown in FIG. 3 determines whether the current level of the first reference cell 28 (first reference level) and the current level of the second reference cell 36 (second reference level) should be compared with each other on the basis of, for example, the number of times data has been read from the memory cell array 10 (step S10). When the answer is NO, the control ends. In contrast, when the answer is YES, the comparator circuit 32 obtains the current Ish of the first reference cell 28 and the current I2 of the second reference cell 36 (steps S12 and S14). The adjustment circuit 30 determines whether the difference (I2-Ish) is greater than a predetermined value IL (step S16). When the answer is NO, the control ends. When the answer is YES, the trimming circuit 34 adjusts the current level of the first reference cell 28 with reference to the current level I2 of the second reference cell 36 to a level Iaj (FIG. 5) approximately equal to the initial level (step S18). The comparator circuit 32 may perform the comparing operation after converting the current levels of the first reference cell 28 and the second reference cell 36 into respective voltages.

According to the first embodiment, the first reference cell 28 is used for reading data from the memory cells 12. When the first reference level, which is the current level of the first reference cell 28, changes, the adjustment circuit 30 adjusts the current level (first reference level), at steps S16 and S18 shown in FIG. 4. Thus, even when the first reference level of the first reference cell 28 shifts due to charge gain, the first reference level can be restored to the initial current level by using the second reference cell 36.

As described above, preferably, the second reference cell 36 compared with the first reference level of the first reference cell 28 is employed, and the first reference level is adjusted on the basis of the result of comparing the second reference level of the second reference cell 36 with the first reference level by the adjustment circuit 30. It is thus possible to easily determine the time when the first reference level should be adjusted.

Preferably, the adjustment circuit 30 compares the first reference level Ish and the second reference level I2 with each other when the difference between Ish and I2 becomes greater than the predetermined value IL. Thus, the first reference level can be adjusted before charge gain of the first reference cell 28 becomes unallowable.

If the frequency of comparing the first and second reference levels with each other (the frequency of YES in step S10) is too many, the second reference level of the second reference cell 36 may be changed due to charge gain. In contrast, if the frequency is too small, the first reference level may be changed greatly. With the above in mind, an appropriate frequency of comparison may be selected. The adjustment circuit 30 may compare the first and second reference levels with each other on the basis of the number of times the memory cell array 10 is read. The adjustment circuit 30 may adjust the first reference level for every predetermined times or a predetermined number of times of power on.

Second Embodiment

Figure 6:
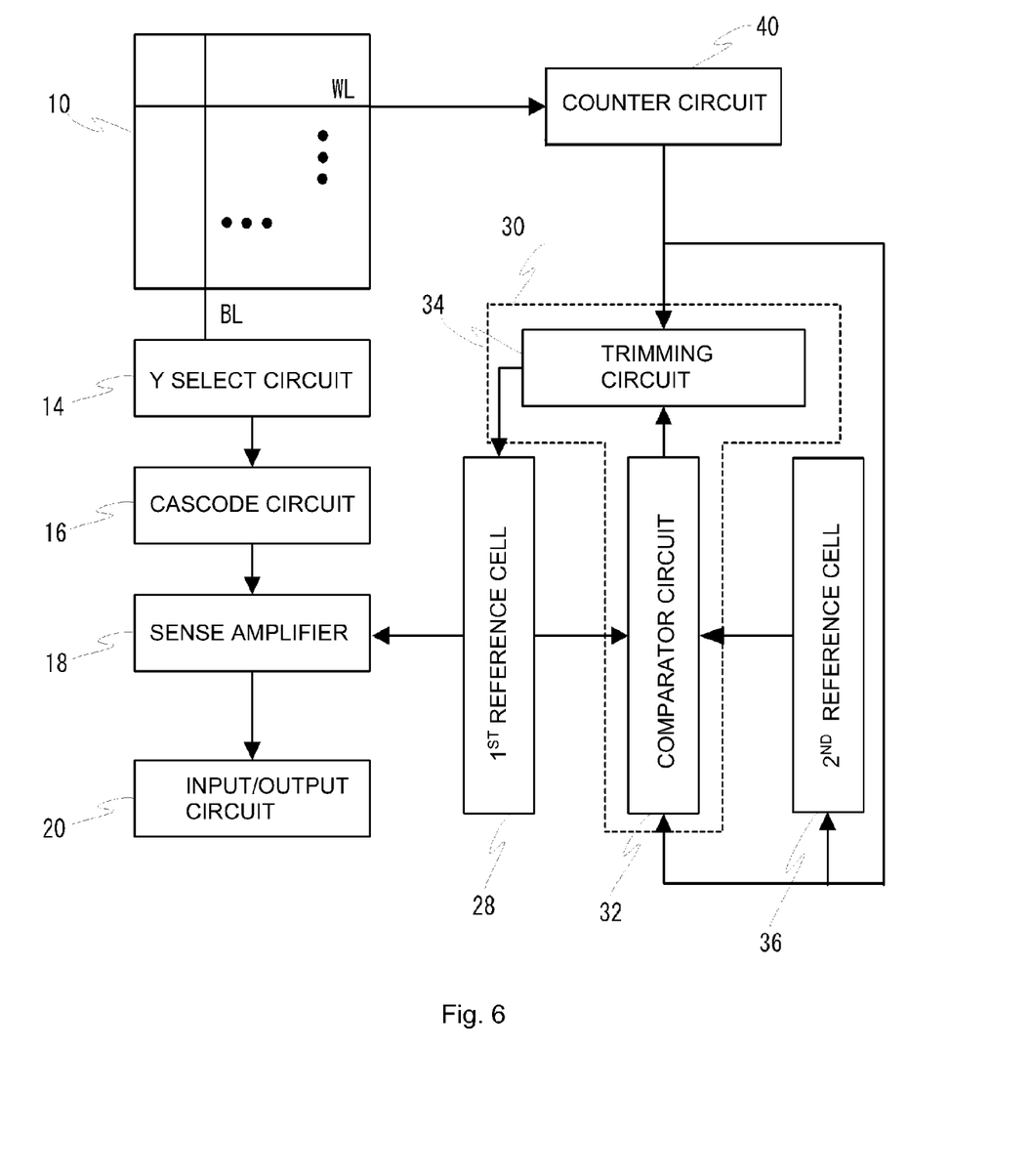
FIG. 6 is a block diagram of a non-volatile memory in accordance with a second embodiment.

A second embodiment employs a counter circuit that accumulates the number of times a specific word line WL is selected. FIG. 6 is a block diagram of the second embodiment. A counter circuit 40 that selects a specific word line WL is added to the structure of the first embodiment shown in FIG. 3. The counter circuit 40 accumulates the number of times the specific word line WL is selected, and outputs an enable signal to the adjustment circuit 30 when the number of times accumulated reaches a predetermined number of times. The adjustment circuit 30 determines that the answer is YES at step S10 shown in FIG. 4 when receiving the enable signal from the counter circuit 40. That is, the adjustment circuit 30 executes steps S12 to S18 to compare the first reference level and the second reference level with each other on the basis of the number of times at least a predetermined one of the word lines WL in the memory cell array 10 is selected. A large-scale counter circuit may be needed to count the number of times data is read from the memory cell array 10. The counter circuit 40 may have a small size because it is associated with only at least one specific word line WL. For example, the counter circuit 40 counts the number of times a specific one of 512 word lines WL is selected. In this case, the number of times of counting may be reduced to approximately 1/500. The counter circuit 40 may count the number of times two or more predetermined word lines WL are selected.

Third Embodiment

Figure 7:
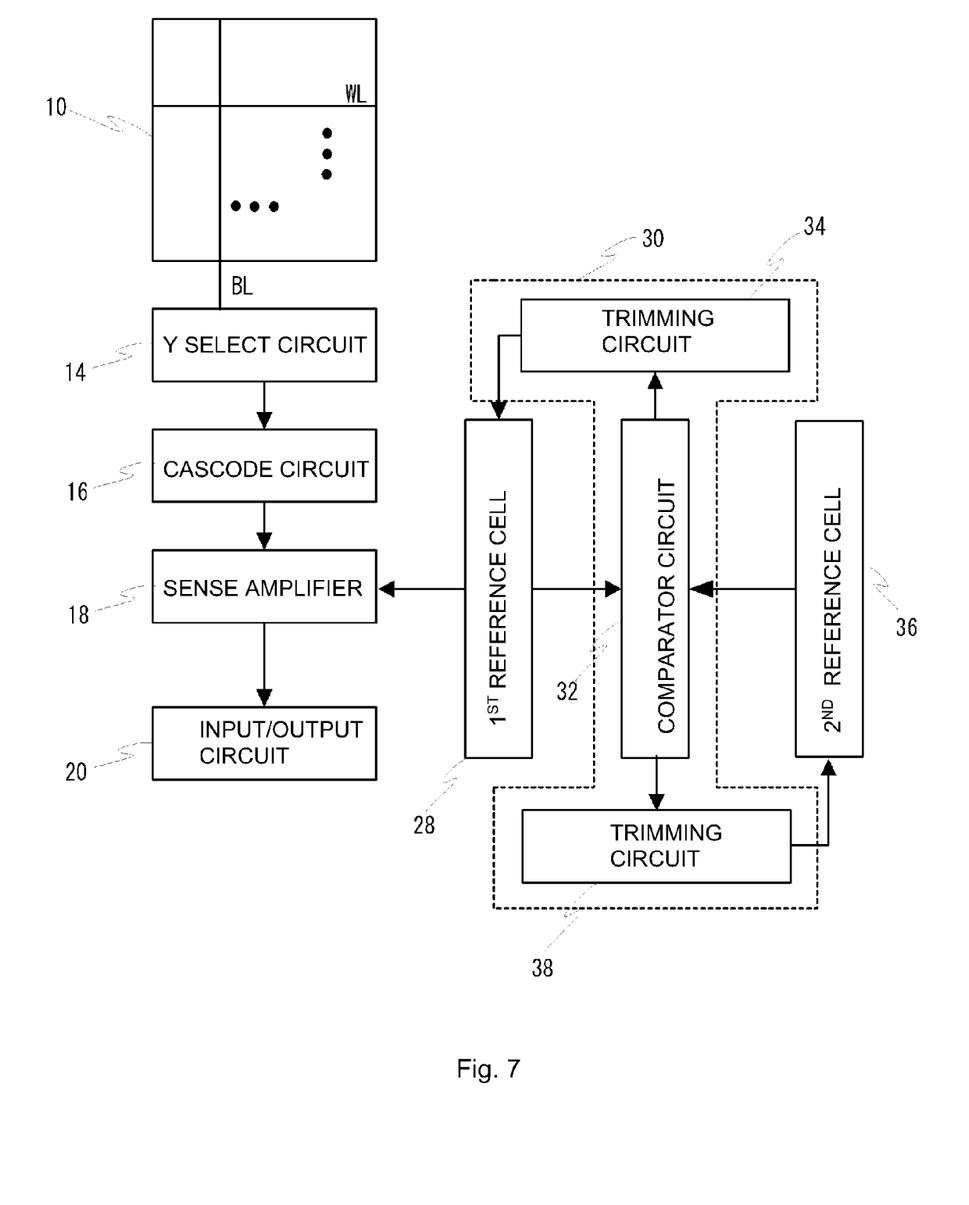
FIG. 7 is a block diagram of a non-volatile memory in accordance with a third embodiment.

A third embodiment is capable of setting the second reference level of the second reference cell 36. FIG. 7 is a block diagram of a non-volatile memory in accordance with the third embodiment. The third embodiment has a trimming circuit 38 in addition to the structure shown in FIG. 3. The trimming circuit 38 sets the second reference level of the second reference cell 36 on the basis of the comparison result from the comparator circuit 32. The remaining structure of the third embodiment is the same as that of the first embodiment.

Figure 8:
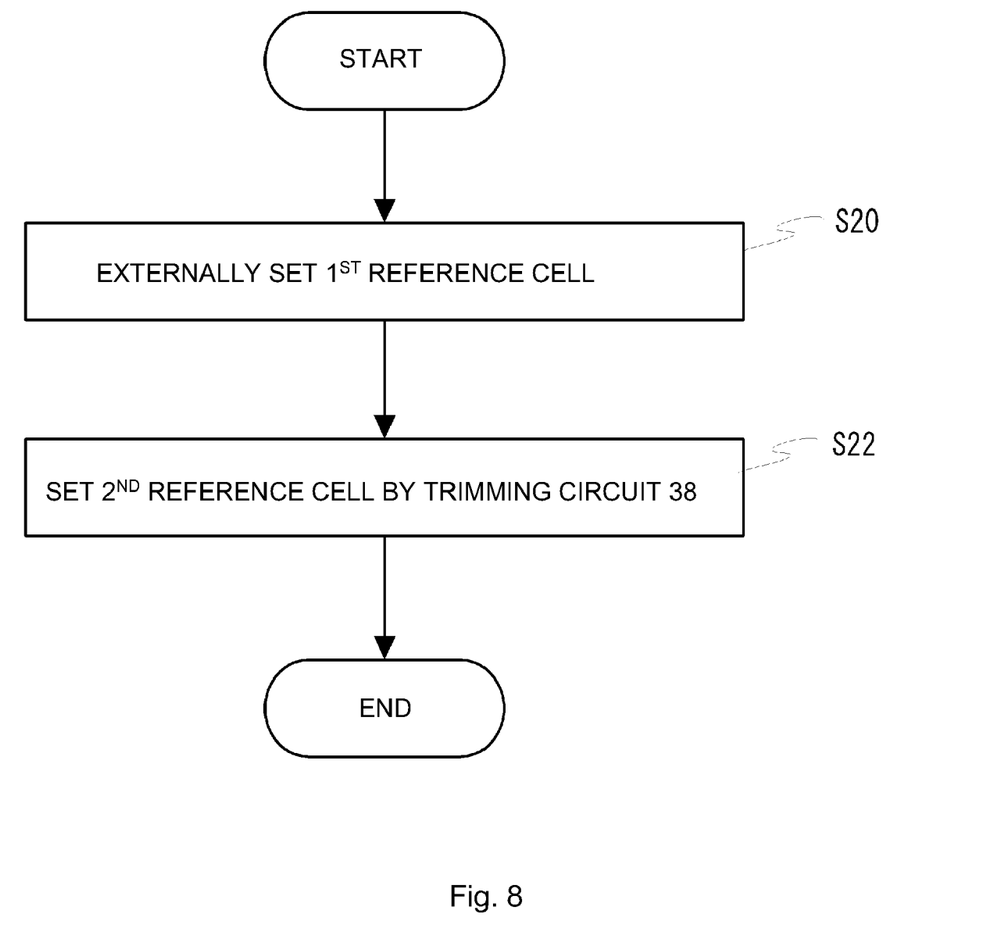
FIG. 8 is a flowchart of an operation of the non-volatile memory in accordance with the third embodiment.

Referring to FIG. 8, the first reference level of the first reference cell 28 is externally set to the initial value Iin, for example, in a test prior to shipment of the non-volatile memory (step S20). Next, the trimming circuit 38 sets the second reference level of the second reference cell 36 to I2 on the basis of the results of comparison made by the comparator circuit 32 (step S32). That is, the first reference level is externally set, and the adjustment circuit 30 sets the second reference level to I2. Thus, there is no need to externally set the second reference cell 36 to I2 in the test prior to shipment. In the test prior to shipment, only the first reference cell 28 is set, and it does not take much time to set the second reference cell 36 to I2.

Preferably, the adjustment circuit 30 sets the second reference level equal to the first reference level. It is thus possible to restore the first reference level to the initial value Iin at step S18 shown in FIG. 4.

The first reference cell 28 may be a reference cell used for programming the memory cells 12. However, the non-volatile memory guarantees a larger number of times of reading than the number of times of writing. Thus, the reference cell involved in data read has more considerable charge gain. Therefore, preferably, the first reference cell 28 is a reference cell used for reading data from the memory cell 12. The first and second reference levels are not limited to current levels but may be voltage levels.

The present invention is not limited to the specifically disclosed embodiments, but may include other embodiments and variations without departing from the scope of the present invention.

The present application is based on Japanese Patent Application No. 2007-025337 filed Feb. 5, 2007, the entire disclosure of which is hereby incorporated by reference.

I claim:

1. A semiconductor device comprising:
a first reference cell used for reading non-volatile memory cells;
a second reference cell; and
an adjustment circuit coupled to the first reference cell operable to adjust a first reference level of the first reference cell back to an original level when the first reference level is changed due to repeated readings, wherein the adjustment circuit compares a second reference level of the second reference cell with the first reference level, and adjusts the first reference level based on the comparison, and wherein the adjustment circuit is operable to set the second reference cell to the second reference level on the basis of the first reference level externally set in the semiconductor device.

2. The semiconductor device as claimed in claim 1, wherein the adjustment circuit compares the second reference level and the first reference level with each other when a difference between the first reference level and the second reference level exceeds a predetermined value.

3. The semiconductor device as claimed in claim 1, wherein the adjustment circuit compares the second reference level and the first reference level with each other on the basis of the number of times the non-volatile memory cells are programmed or read.

4. The semiconductor device as claimed in claim 3, wherein the adjustment circuit compares the second reference level and the first reference level with each other on the basis of the number of times a predetermined word line provided in a memory cell array in which the non-volatile memory cells are included is selected.

5. The semiconductor device as claimed in claim 4, wherein the adjustment circuit compares the second reference level and the first reference level with each other when the number of times the predetermined word line is selected reaches a predetermined number of times.

6. The semiconductor device as claimed in claim 1, wherein the adjustment circuit sets the second reference level equal to the first reference level.

7. The semiconductor device as claimed in claim 1, wherein the first reference cell is used for programming and reading the non-volatile memory cells.

8. A method for controlling a semiconductor device comprising:
comparing a first reference level of a first reference cell used for reading non-volatile memory cells with a second reference level of a second reference cell; and
adjusting the first reference level back to an original level on the basis of a comparison result, wherein the second reference cell is set to the second reference level on the basis of the first reference level externally set in the semiconductor device.

9. The method as claimed in claim 8, further comprising:
accumulating the number of times a predetermined word line is selected,
wherein comparing the first reference level and the second reference level with each other and adjusting the first reference level are executed when the number of times the predetermined word line is selected reaches a predetermined number of times.

10. The method as claimed in claim 8, wherein the first reference cell is used for programming and reading the non-volatile memory cells.

11. The method as claimed in claim 8, further comprising:
setting the second reference level equal to the first reference level.

12. The method as claimed in claim 8, wherein the first reference level is compared to the second reference level when a difference between the first reference level and the second reference level exceeds a predetermined value.

13. The method as claimed in claim 10, further comprising:
accumulating the number of times the non-volatile memory cells are programmed or read, wherein comparing the first reference level and the second reference level with each other and adjusting the first reference level are executed when the number of times the non-volatile memory cells are programmed or read reaches a predetermined number of times.

* * * * *